(12) United States Patent
Zhang et al.

(10) Patent No.: US 9,679,923 B2
(45) Date of Patent: Jun. 13, 2017

(54) ARRAY SUBSTRATE, METHOD FOR MANUFACTURING THE SAME AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengju Zhang, Beijing (CN); Xiaojian Du, Beijing (CN); Bin Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/074,157

(22) Filed: Mar. 18, 2016

(65) Prior Publication Data
US 2017/0012057 A1 Jan. 12, 2017

(30) Foreign Application Priority Data

Jul. 9, 2015 (CN) .......................... 2015 1 0400994

(51) Int. Cl.
*H01L 29/786* (2006.01)
*H01L 27/12* (2006.01)

(52) U.S. Cl.
CPC .......... *H01L 27/124* (2013.01); *H01L 27/127* (2013.01); *H01L 27/1248* (2013.01); *H01L 27/1262* (2013.01); *H01L 29/78669* (2013.01); *H01L 29/78678* (2013.01)

(58) Field of Classification Search
CPC ............... H01L 27/124; H01L 27/1248; H01L 27/1262; H01L 27/127; H01L 29/78669; H01L 29/78678
See application file for complete search history.

(56) References Cited

U.S. PATENT DOCUMENTS 8,933,454 B2 * 1/2015 Kim .................. G02F 1/136227
257/59
2004/0201803 A1 * 10/2004 Yang ................. G02F 1/136259
349/114

(Continued)

*Primary Examiner* — Allan R Wilson
(74) *Attorney, Agent, or Firm* — Harness, Dickey & Pierce, P.L.C.

(57) ABSTRACT

An array substrate includes a base substrate, a gate electrode, a gate insulating layer and an active layer arranged on the base substrate in a laminated way. The array substrate further includes a passivation layer, a source electrode, a drain electrode, a first electrode and a second electrode. A first via hole arranged in the passivation layer may include two sloped lateral faces arranged opposite to each other. The first electrode may at least partially cover one lateral face of the first via hole. The second electrode electrically connected to a common electrode lead may at least partially cover the other lateral face of the first via hole. The source electrode and the drain electrode may be connected to the active layer through a second via hole which is arranged in the passivation layer. The first electrode is electrically connected to the source electrode or the drain electrode.

20 Claims, 2 Drawing Sheets

(56) References Cited

U.S. PATENT DOCUMENTS

2005/0264747 A1* 12/2005 Shin .................... G02F 1/13458
349/152
2016/0079287 A1* 3/2016 Yan .................... H01L 27/1259
438/158

* cited by examiner

--Prior Art--

ARRAY SUBSTRATE, METHOD FOR MANUFACTURING THE SAME AND DISPLAY DEVICE

CROSS-REFERENCE FOR RELATED APPLICATION

This application claims the priority to Chinese Patent Application No. 201510400994.0 filed with the Chinese State Intellectual Property Office on Jul. 9, 2015, which is incorporated herein by reference in its entirety.

TECHNICAL FIELD

The present disclosure relates to the field of display technology, and particularly to an array substrate, a method for manufacturing the same and a display device.

BACKGROUND

In the Advanced-Super Dimensional Switching (Advanced-Super Dimensional Switching, abbreviated as ADS) display technology, a multi-dimensional electric field is formed by an electric field generated at an edge of a slit electrode in a same plane and another electric field generated between a slit electrode layer and a plate electrode layer, so that all orientation liquid crystal molecules between the slit electrodes and above the slit electrodes in a liquid crystal cell can rotate, thereby improving work efficiency of the liquid crystal.

Figure 1:
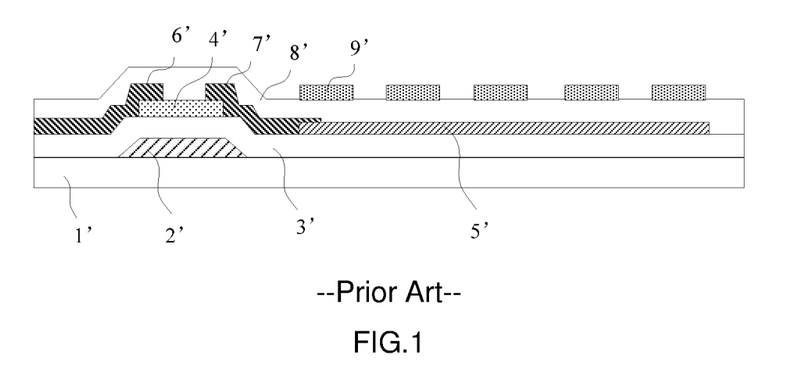
FIG. 1 is a schematic diagram of an array substrate in the conventional technology.

Normally, a display device in the ADS display technology includes an array substrate, as shown in FIG. 1. The array substrate includes a base substrate 1', and a gate electrode 2', a gate insulating layer 3', an active layer 4', a pixel electrode 5', a source electrode 6', a drain electrode 7', a passivation layer 8' and a common electrode 9' arranged sequentially on the base substrate 1' in a laminated way. In the conventional technology, a method for manufacturing the ADS array substrate described above normally includes five patterning processes. The five patterning processes described above include a first patterning process for forming the gate electrode 2', a second patterning process for forming the active layer 4', a third patterning process for forming the pixel electrode 5', a fourth patterning process for forming the source electrode 6' and the drain electrode 7' and a fifth patterning process for forming the common electrode 9'. Accordingly the array substrate is manufactured with the above processes.

However, since the number of the patterning processes will directly affect manufacture cost and the yield, that is, the more the number of the patterning processes, the longer the production cycle, the higher the manufacturing cost, and the lower the yield. Therefore, an urgent technical problem to be solved in a process of manufacturing the array substrate is how to reduce the number of the patterning processes.

SUMMARY

An object of the present disclosure is to provide an array substrate and a method for manufacturing the same, and a display device, to reduce the number of patterning processes used in the process of manufacturing the array substrate.

In order to realize the object described above, technical solutions as follows are adopted in the present disclosure.

According to a first aspect of the present disclosure, an array substrate is provided, which includes: a base substrate, a gate electrode, a gate insulating layer and an active layer arranged on the base substrate in a laminated way, the array substrate further includes a passivation layer arranged on the active layer, a source electrode, a drain electrode, a first electrode and a second electrode arranged on the passivation layer and on a same layer, where a first via hole is arranged in the passivation layer, and the first via hole comprises two sloped lateral faces arranged opposite to each other, the first electrode at least partially covers one lateral face of the first via hole, the second electrode at least partially covers the other lateral face of the first via hole, the second electrode is electrically connected to a common electrode lead; and where a second via hole is further arranged in the passivation layer, the source electrode and the drain electrode are connected to the active layer through the second via hole, and the first electrode is electrically connected to the source electrode or the drain electrode.

The array substrate provided in the present disclosure has a structure above, since the source electrode, the drain electrode, the first electrode and the second electrode are arranged onto the same layer on the passivation layer, the source electrode, the drain electrode, the first electrode and the second electrode are formed by one patterning process. And in order to electrically connect the first electrode with the source electrode or the drain electrode, another patterning process is added to form the via hole on the passivation layer. Compared with the conventional technology that three patterning processes are involved in forming the source electrode, the drain electrode, the pixel electrode and the common electrode, only two patterning processes are involved in forming the source electrode, the drain electrode, the pixel electrode and the common electrode in the present disclosure, thereby reducing one patterning process. Also since the more the number of the patterning processes, the lower the yield, in the present disclosure, the number of the patterning processes is reduced and the yield of manufacturing the array substrate can be improved.

According to an alternative embodiment of the present disclosure, multiple data lines may be arranged on the base substrate, the multiple data lines may be arranged on a same layer as the source electrode and the drain electrode; and the two lateral faces of the first via hole may be close to two adjacent data lines respectively, and be arranged in parallel with the two adjacent data lines.

According to an alternative embodiment of the present disclosure, the first electrode may cover one lateral face of the first via hole completely, and a bottom of the first electrode may extend towards the second electrode, and a top of the first electrode may extend in a direction away from the second electrode, and the second electrode may cover the other lateral face of the first via hole completely, and a bottom of the second electrode may extend towards the first electrode, and a top of the second electrode may extend in a direction away from the first electrode.

According to an alternative embodiment of the present disclosure, the common electrode lead may be arranged on a same layer as the gate electrode, a third via hole corresponding to the second electrode may be arranged in the gate insulating layer, the second electrode may be electrically connected to the common electrode lead through the third via hole.

According to an alternative embodiment of the present disclosure, the passivation layer may be made of resin or silicon nitride.

According to an alternative embodiment of the present disclosure, a thickness of the passivation layer made of resin may be approximately 2 micrometer, or a thickness of the passivation layer made of silicon nitride may be within a range from 0.6 micrometer to 1 micrometer.

According to an alternative embodiment of the present disclosure, the thickness of the passivation layer made of silicon nitride may be approximately 1 micrometer.

According to an alternative embodiment of the present disclosure, the first electrode and the second electrode may be each made of metallic.

In addition, the present disclosure further provides a display device, the display device includes the array substrate described above.

In addition, the present disclosure further provides a method for manufacturing an array substrate, including steps as follows:

forming a pattern comprising a gate electrode on a base substrate by a first patterning process;

forming a gate insulating layer on the base substrate on which the pattern comprising the gate electrode is formed;

forming a pattern comprising an active layer on the base substrate on which the gate insulating layer is formed by a second patterning process;

forming a passivation layer on the base substrate on which the pattern comprising the active layer is formed, forming a first via hole and a second via hole which corresponds to the active layer by a third patterning process, where the first via hole comprises two sloped lateral faces arranged opposite to each other; and forming a pattern comprising a source electrode, a drain electrode, a first electrode and a second electrode on the base substrate on which the passivation layer is formed by a fourth patterning process, where the first electrode at least partially covers one lateral face of the first via hole, the second electrode at least partially covers the other lateral face of the first via hole, the source electrode and the drain electrode are connected to the active layer through the second via hole, the first electrode is electrically connected to the source electrode or the drain electrode, and the second electrode is electrically connected to a common electrode lead.

The method for manufacturing the array substrate has the same advantages as the array substrate described above compared to the conventional technology, which is not described here any more.

BRIEF DESCRIPTION OF THE DRAWINGS

In order to more clearly illustrate the technical solution in the embodiments of the present disclosure or in the conventional technology, in the following, drawings required in the description of the embodiments will be introduced simply. Obviously, the drawings in the following description are some embodiments of the present disclosure. For those skilled in the art, other drawings can also be obtained according to the drawings without any creative work.

REFERENCE NUMERALS

1—base substrate; 2—gate electrode; 3—gate insulating layer; 4—active layer; 5—passivation layer; 51—first via hole; 52—second via hole; 6—source electrode; 7—drain electrode; 8—first electrode; 9—second electrode; 10—common electrode lead; 11—data line; 12—gate line.

DETAILED DESCRIPTION

The embodiments of the present disclosure are further described below in conjunction with the drawings and the embodiments. The embodiments below are only used to illustrate the present disclosure, and are not used to limit the scope of the present disclosure.

In order to make the objectives, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

The present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments without any creative work, which also fall within the scope of the present disclosure.

First Embodiment

Figure 2:
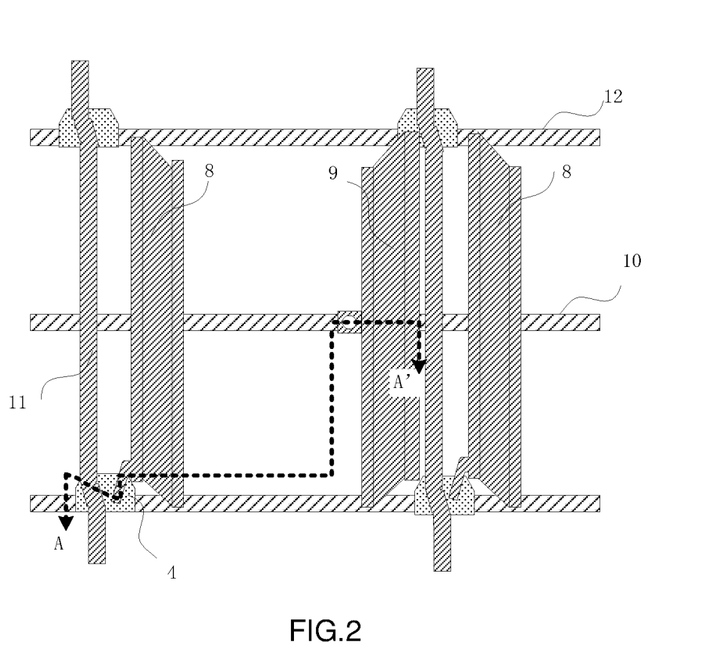
FIG. 2 is a plan view of an array substrate provided in the embodiments of the present disclosure.
Figure 3:
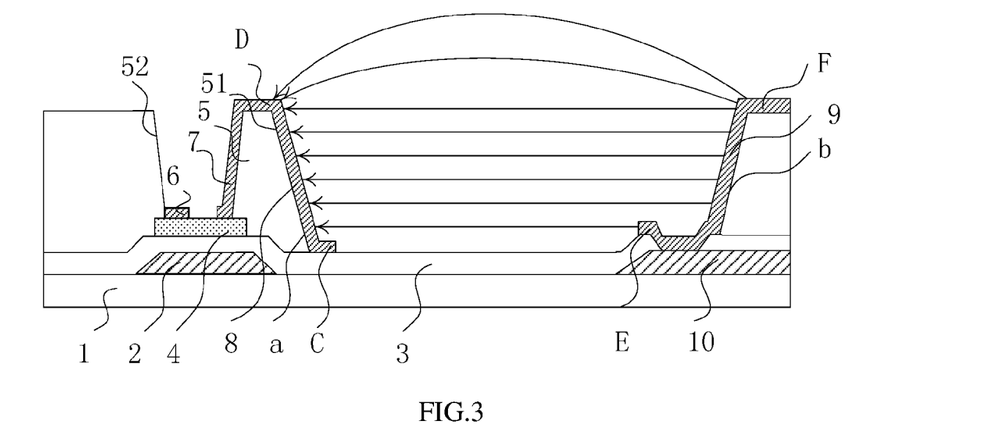
FIG. 3 is a cross-sectional view in an A-A' direction in FIG. 2.

An array substrate is provided in the first embodiment of the present disclosure, as shown in FIG. 2 and FIG. 3, the array substrate includes a base substrate 1, a gate electrode 2, a gate insulating layer 3 and an active layer 4 arranged on the base substrate 1 in a laminated way. The array substrate further includes a passivation layer 5 arranged on the active layer 4 and a source electrode 6, a drain electrode 7, a first electrode 8 and a second electrode 9 arranged on the passivation layer 5 and on a same layer. Specifically, a first via hole 51 is arranged in the passivation layer 5, and the first via hole 51 includes two sloped lateral faces arranged opposite to each other, the first electrode 8 at least partially covers one lateral face of the first via hole 51, the second electrode 9 at least partially covers the other lateral face of the first via hole 51, the second electrode 9 is electrically connected to a common electrode lead 10. A second via hole 52 is further arranged in the passivation layer 5, the source electrode 6 and the drain electrode 7 are connected to the active layer 4 through the second via hole 52, and the first electrode 8 is electrically connected to the source electrode 6 or the drain electrode 7.

In a process of manufacturing the array substrate, since the source electrode 6, the drain electrode 7, the first electrode 8 and the second electrode 9 are arranged onto the same layer on the passivation layer, therefore, the source electrode 6, the drain electrode 7, the first electrode 8 and the second electrode 9 are formed by one patterning process. And in order to electrically connect the first electrode 8 with the source electrode 6 or the drain electrode 7, another patterning process is added to form the via hole in the passivation layer 5. Compared with the conventional technology that three patterning processes are involved in forming the source electrode, the drain electrode, the first electrode and the second electrode, only two patterning processes are involved in forming the source electrode 6, the drain electrode 7, the first electrode 8 and the second electrode 9 in the present disclosure, thereby reducing one patterning process. Also since the more the number of the patterning processes, the lower the yield, the number of the patterning processes is reduced in the embodiments of the present disclosure, and the yield of manufacturing the array substrate can be improved.

It should be illustrated that, firstly, the passivation layer 5 may be made of resin or silicon nitride, may also be made of other common material. For example, a thickness of the passivation layer 5 made of resin is within a range from 1.5 micrometer to 2 micrometer. Since the thicker the passivation layer 5, as shown in FIG. 3, the deeper the first via hole 51, the greater an opposite area between the first electrode 8 and the second electrode 9, the stronger the electric field strength of a horizontal electric field between the first electrode 8 and the second electrode 9. Therefore, preferably, the thickness of the passivation layer 5 made of resin is approximately 2 micrometer, and the thickness of the passivation layer 5 made of silicon nitride is within a range from 0.6 micrometer to 1 micrometer. In the same way, preferably, the thickness of the passivation layer 5 made of silicon nitride is approximately 1 micrometer. It can be known from the conventional technology that the thickness of the first electrode 8 is normally within a range from 0.3 micrometer to 0.4 micrometer. It can be known from above that the thickness of the passivation layer 5 is greater than the thickness of the first electrode 8. Therefore, the opposite area between the first electrode 8 and the second electrode 9 in the present disclosure is greater than an opposite area between the slit electrodes on the same plane in the conventional technology, so that the electric field strength of the horizontal electric field between the first electrode 8 and the second electrode 9 is stronger in the present disclosure, thereby increasing a driving force for the liquid crystal, and improving the work efficiency of the liquid crystal and light transmittance of the array substrate.

In addition, since the thickness of the passivation layer 5 made of resin is greater than the thickness of the passivation layer 5 made of silicon nitride, and it can be known that the thicker the passivation layer 5, the stronger the electric field strength of the horizontal electric field between the first electrode 8 and the second electrode 9. Therefore, preferably, the passivation layer 5 is made of resin. In this case, the opposite area between the first electrode 8 and the second electrode 9 can be increased, and the electric field strength of the horizontal electric field between the first electrode 8 and the second electrode 9 is strengthened, thereby improving the work efficiency of the liquid crystal and light transmittance of the array substrate.

Secondly, the first electrode 8 and the second electrode 9 may be each made of a nontransparent conductive material or a transparent conductive material. For example, the transparent conductive material is an Indium-Tin Oxide (ITO) material. The nontransparent conductive material is a metal material. Preferably, the first electrode 8 and the second electrode 9 are each made of metal, which can avoid a problem that etching is not sufficient and particles exist in a process of forming the first electrode 8 and the second electrode 9 made of the Indium-Tin Oxide material.

Thirdly, the first via hole 51 includes two sloped lateral faces arranged opposite to each other. As shown in FIG. 3, the first electrode 8 and the second electrode 9 corresponding to the two lateral faces of the first via hole 51 are arranged opposite to each other. Also, inclination angles of the first electrode 8 and the second electrode 9 relative to the base substrate 1 are greater than 0 degree and less than 90 degrees. In order to increase the opposite area between the first electrode 8 and the second electrode 9, preferably, the inclination angles of the first electrode 8 and the second electrode 9 relative to the base substrate 1 are greater than 60 degrees and less than 90 degrees respectively, and the inclination angle of the first electrode 8 is identical as the inclination angle of the second electrode. In this case, the opposite area between the first electrode 8 and the second electrode 9 may be increased, and the horizontal electric field between the first electrode 8 and the second electrode 9 may be increased, thereby further improving the work efficiency of the liquid crystal and the light transmittance.

Fourthly, the source electrode 6 and the drain electrode 7 are connected to the active layer 4 through the second via hole 52. That is, for example, as shown in FIG. 3, the source electrode 6 is located on a bottom face of the second via hole 52, and the drain electrode 7 is located on a lateral face of the active layer 4, and the source electrode 6 is not connected to the drain electrode 7. The first electrode 8 is electrically connected to the source electrode 6 or the drain electrode 7 through the first via hole 51. That is, for example, as shown in FIG. 3, the first electrode 8 is electrically connected to the drain electrode 7 through the first via hole 51. since the drain electrode 7 is normally referred to as the source electrode 6, the first electrode 8 is electrically connected to the source electrode 6 through the first via hole 51.

In the embodiment described above, as shown in FIG. 2, the first electrode 8 and the second electrode 9 may be arranged in parallel in extension directions of the first electrode 8 and the second electrode 9. In addition, the first electrode 8 and the second electrode 9 may also not be arranged in parallel, as long as that the first electrode 8 does not intersect with the second electrode 9. Preferably, the first electrode 8 and the second electrode 9 are arranged in parallel, intervals between the first electrode 8 and the second electrode 9 are the same in this case. The electric field strength of the horizontal electric field between the first electrode 8 and the second electrode 9 are the same, therefore, the driving force of the horizontal electric field for the liquid crystal is the same, and the light transmittance of the array substrate is the same too.

Furthermore, as shown in FIG. 2, data lines 11 are also arranged on the base substrate 1, and the data lines 11 are arranged on the same layer as the source electrode 6 and the drain electrode 7. In addition, gate lines 12 are also arranged on the base substrate 1, and the gate lines 12 are arranged on the same layer as the gate electrode 2. Specifically, the corresponding gate lines 12 and the corresponding data lines 11 surround a pixel unit. For example, the first electrode 8 and the second electrode 9 may be in a center region of the pixel unit, or may also be close to data lines 11 for defining the pixel unit. Preferably, the first electrode 8 and the second electrode 9 are close to the data lines 11 for defining the pixel unit, respectively. Compared with a case that the first electrode 8 and the second electrode 9 are each located inside of the pixel unit, in a case that the first electrode 8 and the second electrode 9 are close to the data lines 11 of the pixel unit, respectively, the number of drivable liquid crystal in the pixel unit may be increased, thereby further improving the work efficiency of the liquid crystal and the light transmittance. Therefore, preferably, the first electrode 8 and the second electrode 9 are close to the data lines 11 for defining the pixel unit, namely, the two lateral faces of the first via hole 51 are close to two adjacent data lines 11 respectively.

Furthermore, the first electrode 8 and the second electrode 9 may be parallel to the data lines 11, respectively, or may also form a certain angle. The angle may be greater than 0 degree and less than 90 degrees. Preferably, as shown in FIG. 2, the first electrode 8 and the second electrode 9 are parallel to the data lines 11, respectively, all liquid crystal within the pixel unit may be driven in a case that the first electrode 8 and the second electrode 9 are parallel to the data lines 11 respectively, thereby further raising the work efficiency of the liquid crystal and the light transmittance. Therefore, preferably, the first electrode 8 and the second electrode 9 are parallel to the data lines 11, namely, two lateral faces of the first via hole 51 are each arranged in parallel with the data lines.

In the embodiment described above, the first electrode 8 at least partially covers one lateral face of the first via hole 51, and the second electrode 9 at least partially covers the other lateral face of the first via hole. That is, the first electrode 8 and the second electrode 9 may at least partially cover corresponding lateral faces of the first via hole 51 respectively, or may completely cover the corresponding lateral faces of the first via hole 51 respectively. Alternatively, one of the first electrode 8 and the second electrode 9 partially covers one lateral face of the first via hole 51, and another of the first electrode 8 and the second electrode 9 completely covers the other lateral face of the first via hole. Preferably, the first electrode 8 and the second electrode 9 both completely cover the corresponding lateral faces of the first via hole 51 respectively, which can increase the opposite area between the first electrode 8 and the second electrode 9, and enhance the electric field strength of the horizontal electric field between the first electrode 8 and the second electrode 9, thereby further improving the work efficiency of the liquid crystal and the light transmittance of the array substrate.

Furthermore, as shown in FIG. 3, the first electrode 8 completely covers one lateral face indicated by sign "a" of the first via hole 51, and a bottom of the first electrode 8 extends towards the second electrode 9, and a top of the first electrode extends towards a direction away from the second electrode 9. The second electrode 9 completely covers the other lateral face indicated by sign "b" of the first via hole 51, and a bottom of the second electrode 9 extends towards the first electrode 8, and a top of the second electrode 9 extends towards a direction away from the first electrode 8. Specifically, for example, as shown in FIG. 3, a part C of the first electrode 8 extends towards the second electrode 9, and the extending length of the part C of the first electrode 8 may be set based on the interval between the lateral face "a" and the lateral face "b" of the first via hole 51. A part D of the first electrode 8 extends towards the direction away from the second electrode 9, and the extending length of the part D of the first electrode 8 may be set based on an interval between the first via hole 51 and the second via hole 52. A part E of the second electrode 9 extends towards the first electrode 8, and the extending length of the part E of the second electrode 9 may be set based on the interval between the lateral face "a" and the lateral face "b" of the first via hole 51. A part F of the second electrode 9 extends towards the direction away from the first electrode 8, and the extending length of the part F of the second electrode 9 may be set based on an interval between the first via hole 51 and a second via hole 52 within an adjacent pixel unit. In this way, sloped electric fields may be generated between the part C of the first electrode 8 and the part E of the second electrode 9, and between the part D of the first electrode 8 and the part F of the second electrode 9, so that a multi-dimensional electric field may be formed, thereby further improving the work efficiency of the liquid crystal and improving the light transmittance of the array substrate.

In the embodiment described above, the common electrode lead 10 may be arranged separately, or the common electrode lead 10 may be arranged on a same layer as the gate electrode 2. Preferably, as shown in FIG. 3, the common electrode lead 10 is set on the same layer as the gate electrode 2, a third via hole corresponding to the second electrode 9 is arranged in the gate insulating layer 3, the second electrode 9 is electrically connected to the common electrode lead 10 through the third via hole. Since that the common electrode lead 10 is arranged on the same layer as the gate electrode 2, the common electrode lead 10 and the gate electrode 2 may be formed simultaneously, thereby reducing the number of patterning process used in the process of manufacturing the array substrate, and reducing manufacture cost and improving the yield.

In addition, the embodiments of the present disclosure further provide a display device, which includes the array substrate mentioned in the technical solution described above. Specifically, the display device may be any product or component having a display function such as an electronic paper, a phone, a tablet computer, a TV, a display, a laptop computer or a navigator.

Second Embodiment

Figure 4:
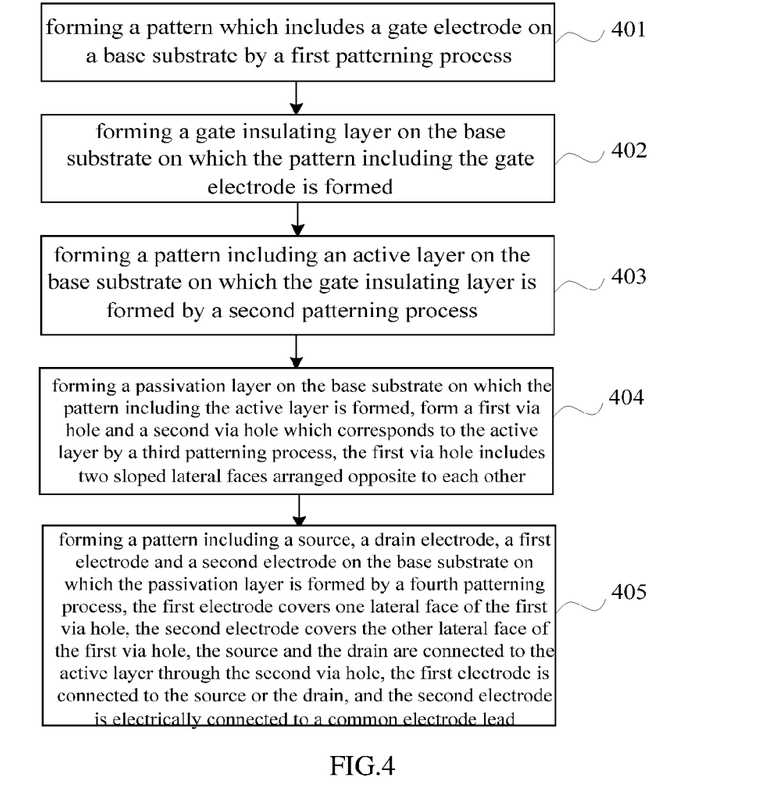
FIG. 4 is a flow chart for manufacturing an array substrate according to an embodiment of the present disclosure.

The embodiment of the present disclosure provides a method for manufacturing an array substrate, as shown in FIG. 4, the method includes steps 401 to 405.

In step 401, a pattern including a gate electrode is formed on a base substrate by a first patterning process. For example, a conduction layer is formed on the base substrate by plasma enhanced chemical vapor deposition, sputtering, thermal evaporation or the like, photoresist is coated on the conduction layer, a mask having a pattern of a gate electrode is used to cover the conduction layer on which the photoresist is coated, and the pattern including the gate electrode is formed after steps such as exposing, developing and etching.

In step 402, a gate insulating layer is formed on the base substrate on which the pattern including the gate electrode is formed. For example, the gate insulating layer is formed on the base substrate on which the pattern including the gate electrode is formed by plasma enhanced chemical vapor deposition, sputtering, thermal evaporation or the like.

In step 403, a pattern including an active layer is formed on the base substrate on which the gate insulating layer is formed by a second patterning process. for example, a semiconductor layer is formed on the base substrate on which the gate insulating layer is formed by a method such as plasma enhanced chemical vapor deposition, photoresist is coated on the semiconductor layer, and a mask having a pattern including the active layer is used to cover the semiconductor layer on which the photoresist is coated, and the pattern including the active layer is formed after steps such as exposing, developing.

In step 404, a passivation layer is formed on the base substrate on which the pattern including the active layer is formed, and a first via hole and a second via hole which corresponds to the active layer are formed by a third patterning process, the first via hole includes two sloped lateral faces arranged opposite to each other. For example, the passivation layer is formed on the base substrate on which the pattern including the active layer is formed by plasma enhanced chemical vapor deposition, sputtering, thermal evaporation or the like, and a mask having a pattern including the first via hole and the second via hole is used to cover the passivation layer on which the photoresist is coated, and the pattern including the first via hole and the second via hole is formed after steps such as the exposing and developing.

In step 405, a pattern including a source electrode, a drain electrode, a first electrode and a second electrode is formed on the base substrate on which the passivation layer is formed by a fourth patterning process. Specifically, the first electrode at least partially covers one lateral face of the first via hole, the second electrode at least partially covers the other lateral face of the first via hole, the source electrode and the drain electrode are connected to the active layer through the second via hole, and the first electrode is electrically connected to the source electrode or the drain electrode, the second electrode is electrically connected to the common electrode lead. For example, a conduction layer is formed on the base substrate on which the passivation layer is formed by plasma enhanced chemical vapor deposition, sputtering, thermal evaporation or the like, photoresist is coated on the conduction layer, a mask having a pattern of the source electrode, the drain electrode, the first electrode and the second electrode is used to cover the conduction layer on which the photoresist is coated, and the pattern including the source electrode, the drain electrode, the first electrode and the second electrode is formed after steps such as exposing, developing and etching.

Since that the source electrode, the drain electrode, the first electrode and the second electrode are formed by one patterning process, and in order to electrically connect the first electrode with the source electrode or the drain electrode, another patterning process is added to form the via hole in the passivation layer. Compared with the conventional technology that three patterning processes are involved in forming the source electrode, the drain electrode, the pixel electrode and the common electrode, only two patterning processes are involved in forming the source electrode, the drain electrode, the pixel electrode and the common electrode in the present disclosure, thereby reducing one patterning process. Also since the more the number of the patterning processes, the lower the yield of the array substrate, in the present disclosure, the number of the patterning processes is reduced and the yield of manufacturing the array substrate can be improved.

In the embodiments of the present disclosure described above, data lines may be formed while forming the source electrode and the drain electrode, two lateral faces of the first via hole are arranged in parallel with the data lines, and are close to two adjacent data lines respectively. In this case, the number of drivable liquid crystal within the pixel unit may be increased, thereby further improving the work efficiency of the liquid crystal and the light transmittance.

In the embodiments described above, the common electrode lead and the gate electrode may be formed simultaneously. In this way, the number of the patterning processes used in the process of manufacturing the array substrate may be reduced, and the manufacture cost may be reduced, and the yield may be improved. After forming the gate insulating layer, the method for manufacturing the array substrate further includes: forming a third via hole corresponding to the second electrode by a patterning process, the second electrode is electrically connected to the common electrode lead through the third via hole. The method for manufacturing the third via hole may refer to the method for manufacturing the first via hole and the second via hole, which is not described any more.

In addition, gate lines are also arranged on the base substrate, for example, a manufacturing process for the gate lines may refer to the conventional process, which is not described any more.

The embodiments of the present disclosure are described herein in a progressive manner, with the emphasis of each of the embodiments on the difference between this embodiment and other embodiments. Hence, for the same or similar parts between the embodiments, one can refer to the other embodiments. For the method embodiment, the description thereof is simple since the method embodiment corresponds to the product embodiment, hence, the related parts can refer to the description of the product embodiment.

The foregoing is only the embodiments of the present disclosure, and the protection scope of the present disclosure is not limited thereto, changes or substitutions thought easily by those skilled in the art within the technical scope of the present disclosure may fall within the protection scope of the present disclosure. Therefore, the protection scope of the present disclosure is subject to the protection scope of the claims.

What is claimed is:

1. An array substrate, comprising:
   a base substrate; and
   a gate electrode, a gate insulating layer and an active layer arranged on the base substrate in a laminated way,
   the array substrate further comprising:
   a passivation layer arranged on the active layer; and
   a source electrode, a drain electrode, a first electrode and a second electrode arranged on the passivation layer and on a same layer,
   wherein a first via hole is arranged in the passivation layer, and the first via hole comprises two sloped lateral faces arranged opposite to each other, the first electrode at least partially covers one lateral face of the first via hole, the second electrode at least partially covers the other lateral face of the first via hole, the second electrode is electrically connected to a common electrode lead; and
   wherein a second via hole is further arranged in the passivation layer, the source electrode and the drain electrode are connected to the active layer through the second via hole, and the first electrode is electrically connected to the source electrode or the drain electrode.

2. The array substrate according to claim 1, wherein a plurality of data lines are arranged on the base substrate, the plurality of data lines are arranged on a same layer as the source electrode and the drain electrode; and
   wherein the two lateral faces of the first via hole are close to two adjacent data lines respectively, and are arranged in parallel with the two adjacent data lines.

3. The array substrate according to claim 2, wherein the first electrode covers one lateral face of the first via hole completely, and a bottom of the first electrode extends towards the second electrode, and a top of the first electrode extends in a direction away from the second electrode; and wherein the second electrode covers the other lateral face of the first via hole completely, and a bottom of the second electrode extends towards the first electrode, and a top of the second electrode extends in a direction away from the first electrode.

4. The array substrate according to claim 1, wherein the common electrode lead is arranged on a same layer as the gate electrode, a third via hole corresponding to the second electrode is arranged in the gate insulating layer, the second electrode is electrically connected to the common electrode lead through the third via hole.

5. The array substrate according to claim 1, wherein the passivation layer is made of resin or silicon nitride.

6. The array substrate according to claim 5, wherein a thickness of the passivation layer made of resin is approximately 2 micrometer, or a thickness of the passivation layer made of silicon nitride is within a range from 0.6 micrometer to 1 micrometer.

7. The array substrate according to claim 6, wherein the thickness of the passivation layer made of silicon nitride is approximately 1 micrometer.

8. The array substrate according to claim 1, wherein the first electrode and the second electrode are each made of metal.

9. A display device comprising an array substrate, the array substrate comprising: a base substrate; and a gate electrode, a gate insulating layer and an active layer arranged on the base substrate in a laminated way, the array substrate further comprising: a passivation layer arranged on the active layer; and a source electrode, a drain electrode, a first electrode and a second electrode arranged on the passivation layer and on a same layer, wherein a first via hole is arranged in the passivation layer, and the first via hole comprises two sloped lateral faces arranged opposite to each other, the first electrode at least partially covers one lateral face of the first via hole, the second electrode at least partially covers the other lateral face of the first via hole, the second electrode is electrically connected to a common electrode lead; and wherein a second via hole is further arranged in the passivation layer, the source electrode and the drain electrode are connected to the active layer through the second via hole, and the first electrode is electrically connected to the source electrode or the drain electrode.

10. The display device according to claim 9, wherein a plurality of data lines are arranged on the base substrate, the plurality of data lines are arranged on a same layer as the source electrode and the drain electrode; and wherein the two lateral faces of the first via hole are close to two adjacent data lines respectively, and are arranged in parallel with the two adjacent data lines.

11. The display device according to claim 10, wherein the first electrode covers one lateral face of the first via hole completely, and a bottom of the first electrode extends towards the second electrode, and a top of the first electrode extends in a direction away from the second electrode; and wherein the second electrode covers the other lateral face of the first via hole completely, and a bottom of the second electrode extends towards the first electrode, and a top of the second electrode extends in a direction away from the first electrode.

12. The display device according to claim 9, wherein the common electrode lead is arranged on a same layer as the gate electrode, a third via hole corresponding to the second electrode is arranged in the gate insulating layer, the second electrode is electrically connected to the common electrode lead through the third via hole.

13. The display device according to claim 9, wherein the passivation layer is made of resin or silicon nitride.

14. The display device according to claim 13, wherein a thickness of the passivation layer made of resin is approximately 2 micrometer, or a thickness of the passivation layer made of silicon nitride is within a range from 0.6 micrometer to 1 micrometer.

15. The display device according to claim 14, wherein the thickness of the passivation layer made of silicon nitride is approximately 1 micrometer.

16. The display device according to claim 9, wherein the first electrode and the second electrode are each made of metal.

17. A method for manufacturing an array substrate, wherein the array substrate comprises a base substrate, and a gate electrode, a gate insulating layer and an active layer arranged on the base substrate in a laminated way, and a passivation layer arranged on the active layer, a source electrode, a drain electrode, a first electrode and a second electrode arranged on the passivation layer and on a same layer, and the method comprises:

forming a pattern which includes the gate electrode on the base substrate by a first patterning process;

forming the gate insulating layer on the base substrate on which the pattern including the gate electrode is formed;

forming a pattern including the active layer on the base substrate on which the gate insulating layer is formed by a second patterning process;

forming the passivation layer on the base substrate on which the pattern including the active layer is formed, forming a first via hole and a second via hole which corresponds to the active layer by a third patterning process, wherein the first via hole includes two sloped lateral faces arranged opposite to each other; and forming a pattern comprising the source electrode, the drain electrode, the first electrode and the second electrode on the base substrate on which the passivation layer is formed by a fourth patterning process, wherein the first electrode at least partially covers one lateral face of the first via hole, the second electrode at least partially covers the other lateral face of the first via hole, the source electrode and the drain electrode are connected to the active layer through the second via hole, the first electrode is electrically connected to the source electrode or the drain electrode, and the second electrode is electrically connected to a common electrode lead.

18. The method according to claim 17, wherein a plurality of data lines are formed while forming the source electrode and the drain electrode; and wherein the two lateral faces of the first via hole are arranged in parallel with the plurality of data lines, and are close to two adjacent data lines respectively.

19. The method according to claim 17, wherein the common electrode lead and the gate electrode are formed simultaneously; and wherein after forming the gate insulating layer, the method further comprises: forming a third via hole corresponding to the second electrode by a patterning process, wherein the second electrode is electrically connected to the common electrode lead through the third via hole.

20. The method according to claim 18, wherein the common electrode lead and the gate electrode are formed simultaneously; and wherein after forming the gate insulating layer, the method further comprises: forming a third via hole corresponding to the second electrode by a patterning process, wherein the second electrode is electrically connected to the common electrode lead through the third via hole.

* * * * *